ELECTRICAL WAFER SWITCHES

Filed May 26, 1955 3 Sheets-Sheet 1

INVENTOR.
EDWIN P. THIAS

BY Ostrolenk, Faber, Gerb & Soffen
ATTORNEYS

Jan. 20, 1959 E. P. THIAS 2,870,274

ELECTRICAL WAFER SWITCHES

Filed May 26, 1955 3 Sheets-Sheet 2

INVENTOR.
EDWIN P. THIAS

BY Ostrolenk, Faber, Gerb & Soffen

ATTORNEYS

Jan. 20, 1959 E. P. THIAS 2,870,274

ELECTRICAL WAFER SWITCHES

Filed May 26, 1955 3 Sheets-Sheet 3

INVENTOR.
EDWIN P. THIAS

BY Ostrolenk, Faber, Gerb & Soffen

ATTORNEYS 2,870,274

ELECTRICAL WAFER SWITCHES

Edwin P. Thias, Hollywood, Calif., assignor to Standard Coil Products Co., Inc., Los Angeles, Calif., a corporation of Illinois Application May 26, 1955, Serial No. 511,227

4 Claims. (Cl. 200—11)

This invention relates to electrical wafer switches and more particularly relates to novel wafer switch constructions useful as switching members in television tuners.

Television tuners are constructed in two basic categories, namely, the turret and the wafer switch types. For many years it has been taken for granted that the turret type of construction is more rugged, more positive and longer lasting than its electrical wafer counterpart. The present invention is directed to overcome many of the shortcomings inherent in prior electrical wafer switch constructions and afford a resultant switch that is cheaper to fabricate and more rugged and more positive in its action than prior wafer switches. While the present invention describes and illustrates the novel wafer switch for television tuners, it is to be understood that it is equally applicable to other electrical devices.

The rotary wafer switch constructions of the prior art, such as used for incremental tuners and otherwise, consisted of a plurality of spring clip contacts mounted in an arcuate fashion about a composition base. A rotatable slip ring or center conductor, with a protruding tip, engaged the spring clips selectively in accordance with its angular position. Contact was accordingly directly established between the center ring and any one of the mounted spring clips which the ring tip engaged. A further contact was arranged to suitably engage the center ring conductor, whereby electrical connection was afforded therefrom to the external circuitry.

For example, in a twelve-channel V. H. F. television tuner, twelve of such spring clips were spacedly mounted about a circular or annular segment, with the contact ring centrally thereof. The group of twelve spring clips and slip ring contactor comprised a circuit section of the tuner. V. H. F. twelve-position tuners commonly have at least four of such circuit sections; one for the antenna input circuit; another for the antenna amplifier output circuit; another for the grid input circuit of the mixer stage; and finally a circuit for the oscillator section, tunable to each of the twelve channels.

The spring clips used on the prior art electrical wafer switches are relatively small elements that have to be accurately shaped and designed with special attention to its required spring tension. The jaws of such spring clips coact with the flat tip of the rotor that passes between the jaws. It is readily apparent that the alignment of the spring clips on the fixed panel or stator is relatively critical to ensure uniform contact pressure with the rotor blade or tip. The composition stator or wafer is suitably perforated and each spring clip is mounted in such perforation by a rivet, eyelet, or equivalent member.

Not only need the angular position of each spring clip be accurate about the stator, but its own alignment in the radial direction with respect to the rotor blade is also important. This will be apparent when it is realized that the rotor of the tuner is detented for each channel position and accordingly comes to rest at the predetermined angular channel positions about the stator. Should, for any reason, a pair of coacting jaws of a spring clip be displaced from its predetermined angular channel position, its prescribed contacting coaction with the rotor blade would not take place. Minimal or in some cases no connection at all would occur, causing arcing or inoperation of the associated circuit. Further, light contacting tends to build up film and dirt that further inhibits optimum performance of the electrical circuits.

Another important shortcoming of the prior electrical wafer switches involves the tedious assembly thereof that did not lend itself to the labor-saving and accuracy of construction afforded by mass production and automation. For example, in a twelve-position wafer switch, the prior designs required a rivet, eyelet or equivalent member for each of the separate spring clips. Each spring clip had a definite spring tension designed into it and had peculiar arcuate shapes and had to be mounted in a predetermined angular relation for suitable contacting with the rotor tip. Thus, twenty-four small elements had to be assembled in accurate position and alignment about the stator.

The present invention eliminates the need for such twenty-four separate small components by substituting only one component in their stead. Furthermore, the construction of the invention wafer assembly with such single sizeable component is performed automatically, eliminating all possible error of alignment, placement or distortion in assembly, as will be set forth in detail hereinafter.

Further deficiencies of the prior electrical wafer switches involved their progressive deterioration with age and usage. For example, the spring tension of the tiny switch clips often would deteriorate during wide temperature ambients wherein connection between the spring clips and the rotor blade could not be assured. Then again, constant usage of switch wafers tended to angularly displace the spring clips about their riveted or eyelet mountings. Since such spring clips are designed to have an optimum contact pressure with the rotor blade when in the predetermined detent position, displacement of any spring clip from its predetermined angular relationship on the stator reduced or avoided suitable electrical contact pressure between the spring clip and the rotor blade. Finally, a well-used prior art wafer switch had weakened or cracked spring material at the small element clips and rendered the whole wafer switch useless.

In accordance with the present invention, a rugged electrical wafer switch is provided having rigid flat plates at each of the plurality of switch points. These rugged contacting plates or planes are located at the detented angular positions about the stator and correspond to the individual circuits required of the switch; in the case of a V. H. F. tuner, twelve. In the invention tuner, the rotor is essentially an insulation disc and does not carry the electrical slip ring as in the prior art counterpart switch. A metal annular ring is located in the vicinity and spacedly from the fixed switch plates and is supported by the same stator as are the switch plates, in a manner to be further detailed hereinafter.

An important feature of the present invention is the provision of a novel spring contactor carried by the rotor that establishes positive electrical interconnection between any desired switch contact plate and the fixed metal ring. In this manner, the rotor with the single contactor connects any one of the plurality of fixed plates with the stationary "collector ring." The single spring contactor between the switch plates and the collector ring is the only movable electrical element. The spring contactor is made rugged in design, sufficient to withstand any range of ambient temperature,, vibration, etc., encountered in the field by the device utilizing the invention switch. There is no "jaw" action corresponding to the prior art spring clip-rotor blade coaction. Misalignment of any of the switch blades in the invention device will in no way deteriorate the electrical connection between such blades and the switch contactor. The flatness of the stationary blades affords identical electrical contacting pressure at any angular distortion possible in the field. Furthermore, one version of the present invention eliminates the need for eyelets and rivets but instead the contact blades are provided with projecting lugs punched and formed from the body of the contact, by means of which the blades are attached directly to the stator to afford a most rigid positioning thereof.

An important feature of the present invention is the manner in which the individual contact plates are arranged with the stator mold. In a preferred form of the invention, all the switch plates are formed in a single metallic sheet, with ribs interjoining each of the plates. The interjoining ribs hold each of the plates in a definite predetermined relationship in their arcuate angular positions about the stator. Furthermore, each switch plate is perforated or otherwise slotted to provide integral lugs projecting therefrom, which become the fastening devices anchoring the stamping to the stator molding.

The plurality of lugs project from the single metallic stamped plate sheet and are secured to the stator to constitute the switch-stator of the invention unit. By severing the interconnecting ribs, the distinct contact plates remain individual and duly fastened in their predetermined positions on the insulating support. In the exemplary embodiment of the invention herein, the inductance coils for the higher V. H. F. channels, namely 7 through 13, constitute the interconnecting ribs between the switch plates thereof; such interconnecting inductance ribs remaining in the final wafer switch, as will be set forth in detail.

The "connecting" ring of the invention wafer switch is secured to the stator and remains fixed throughout the operating conditions of the wafer switch. The collector ring herein is sufficiently spaced from the switch plates on the stator as to minimize and make negligible possible capacitance therebetween. Also the rotor disc is designed such as to minimize possible capacity effects between the switch plates and/or with the collector ring. Thus, higher gain in the tuner circuit is afforded with the minimum capacitance between the switch blades, the rotor, and the collector ring of the wafer switch herein.

A further important feature herein is the captivation of the rotor disc and spring contactor within the stator assembly. The spring contactor of the wafer switch herein is mounted on the rotor, between the switch plates projecting from the stator and the collector ring on the opposite side. The collector ring is secured to the stator and serves to captivate the rotor between the switch plates and the collector ring, all within the molded angular stator as will be set forth in detail hereinafter. Thus, the mechanical arrangements, the mountings and the electrical operation of the wafer switch of the present invention are all predetermined, preadjusted and integrally handled in the device in which it is used.

It is accordingly an object of the present invention to provide a novel electrical wafer switch for a multiple electrical circuit.

A further object of the present invention is to provide a novel wafer switch of rugged construction, with long life and firm electrical operation throughout.

Another object of the present invention is to provide a novel electrical wafer switch having only a single spring contact for a plurality of fixed rigid electrical blades.

A further object of the present invention is to provide a novel electrical wafer switch having minimum capacity effects between the blades thereof and the collector ring.

Still a further object of the present invention is to provide a novel electrical wafer switch construction wherein the individual switch blades thereof are predetermined on the stator by interconnecting ribs.

Still another object of the present invention is to provide a novel electrical wafer switch embodying a stator to which a unitary metallic ring is attached and from which the individual electrical blades thereof are thereupon formulated.

Still a further object of the present invention is to provide a novel electrical wafer switch having fixed rigid electrical plates and a collector ring secured to the stator, and a rotor containing the contact arm captivated therebetween.

A still further object of the present invention is to provide a novel electrical wafer switch construction eliminating eyelets, rivets or spring clips as utilized in the prior art.

Another object of the present invention is to provide a novel electrical wafer switch that maintains electrical contact between its collector ring and the plurality of switch blades despite vibration and wide temperature variation and that is self-adjusting under all operating conditions to provide firm electrical interconnections.

A still further object of the present invention is to provide a novel electrical wafer switch constructed with a minimum number of parts that lends itself to ready mass production and practical automatic fabrication.

The above and further objects of the present invention will become more apparent from the following detailed description of an exemplary embodiment of the invention wafer switch taken in connection with the drawings in which:

Figure 1 is a plan view of the exemplary electrical wafer switch used for a V. H. F. television tuner.

Figure 9:
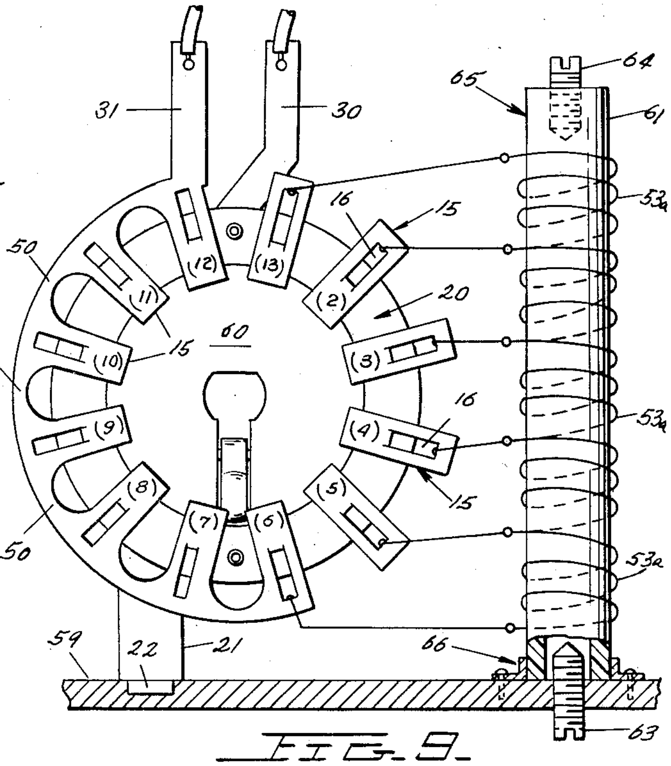

Figure 9 illustrates the electrical wafer switch in circuit connection in a stage of a V. H. F. television tuner.

Figure 10:
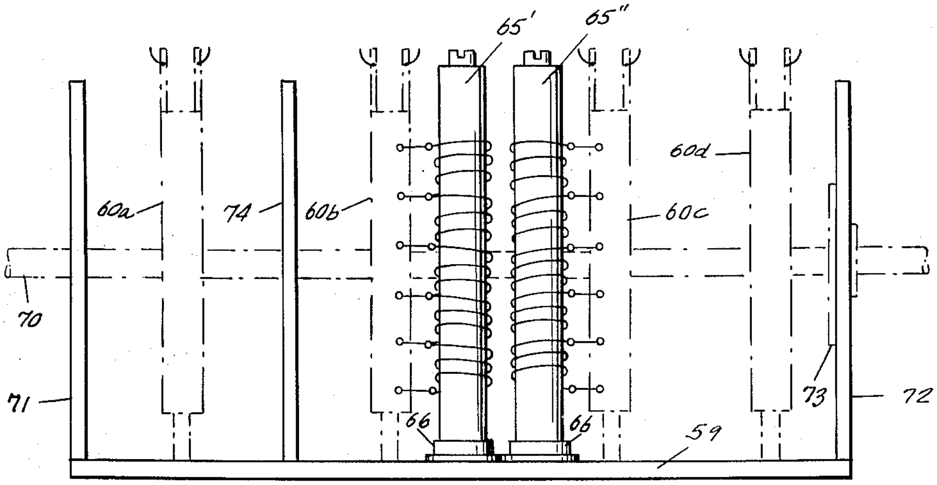

Figure 10 is a diagrammatic representation of a plurality of the electrical wafer switches incorporated in a V. H. F. television tuner.

Figure 1:
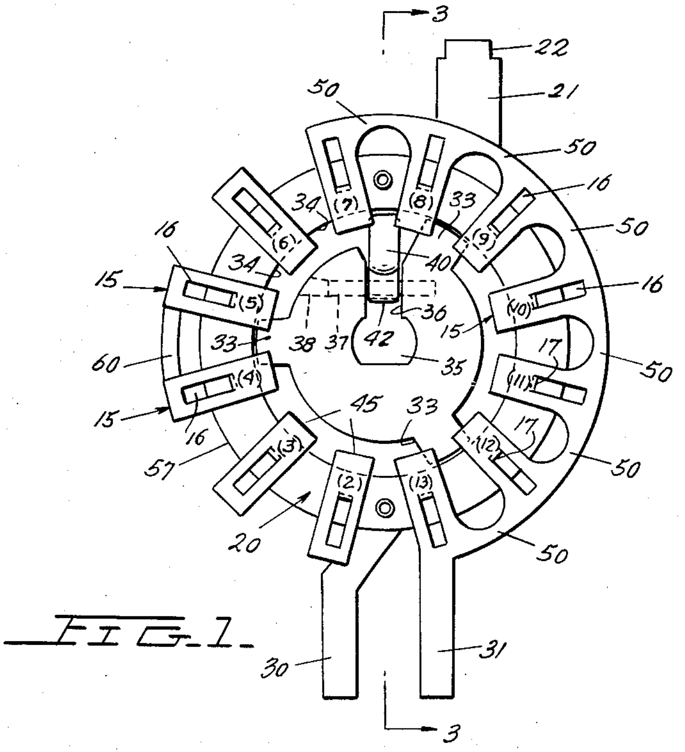
Figure 3:
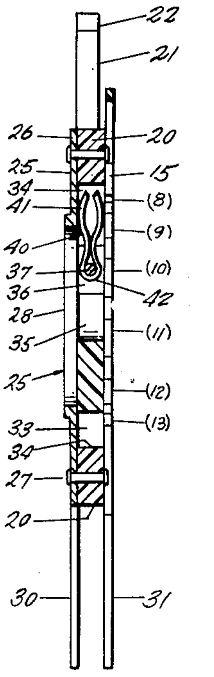
Figure 3 is a cross-sectional view through the wafer switch of Figure 1, taken along the line 3—3 thereof.
Figure 2:
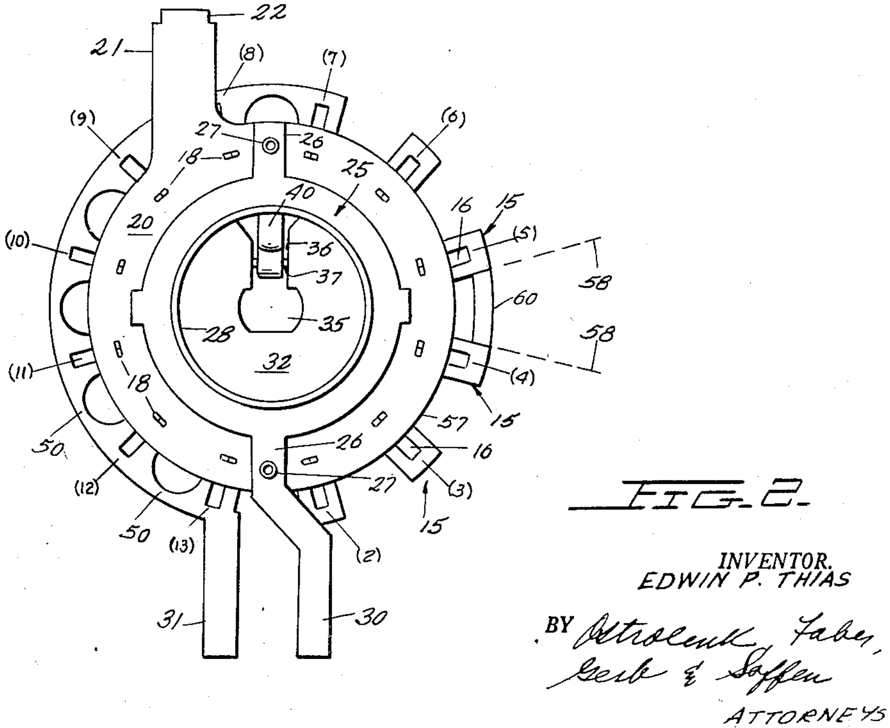
Figure 2 is a rear plan view of the wafer switch of Figure 1.

Figures 1, 2 and 3 illustrate the exemplary embodiment of the invention electrical wafer switch designed for use in a V. H. F. twelve-position television tuner. The wafer switch comprises a switch blade 15 corresponding to each of the twelve desired switching positions. The switch blades 15, 15 are arranged arcuately about the switch and equally spaced, in this instance 30° apart. The twelve switch blades 15, 15 herein correspond to individual channels in the V. H. F. band, namely channels 2 to 13, as marked on each of the switch blades.

Each blade 15 has a slot 16 at its protruding end suitable for electrical interconnection to external circuitry and components. A projection or lug 17 integral with each blade 15 extends through a complementary opening in the insulating support and the extremity of each lug is deformed in such a fashion as to hold the part firmly in position. The tip end 18 of each lug 17 is seen to extend through stator ring 20 through the rear thereof (Figure 2). Blade projections 17, 18 are preferably stamped of the original metal blank containing the switch blades 15, 15 and provide the connection slots 16, 16 in a unitary operation, as will be described more fully hereinafter in connection with Figure 7.

Annular ring 20 is made of moldable composition or plastic material, preferably with a low dielectric constant. The securement of each of the switch blades 15 firmly in position about stator ring 20 is accomplished in the fabrication process and maintained through the projected lugs 17, 17 affixed to the ring 20. Each switch blade 15, 15 is maintained rigidly in its predetermined angular position about ring 20 and in accurate radial alignment thereon with respect to the center of the ring.

The body of lugs 17 is transverse to the body of each blade 15 and affords a maximum rigidity to displacement of the blades from the radial position. By forking the tip 18 of each lug 17 at the bottom face thereof (Figure 2) and staking out the forked tips 18, a firm grip is maintained by lugs 17 to the molded body 20. Optional means of securing the switch blade assembly 15, 15 to a dielectric ring 20 for the purposes herein will be apparent to those skilled in the art. A leg 21 projects integrally from molded stator 20 for the purpose of mounting the wafer switch in an assembly. Leg 21 has a recessed tip 22 to facilitate mounting in a slot of a chassis base, as will be further set forth hereinafter.

A collector ring 25 is provided for the exemplary wafer switch. An important feature of the collector ring 25 is its securement to the stator 20 and its being stationary under all operating conditions. The collector ring 25 has integral projections 26, 26 for securement to the annular ring 20 through eyelets 27, 27. An annular flange or rib 28 projects from the inner edge of collector ring 25 to strengthen it structurally. A connection lug 30 further extends from metal ring 25 for electrical connection to the exterior circuitry. By proportioning the material and thickness of the annular collector ring 25 and its integral projections 26, 26 and 30, the extending lug 30 thereof may be used as part of the mechanical mounting of the wafer switch in conjunction with composition leg 21 of stator 20. A further connection lug 31 is provided in the wafer switch integrally extending from the switch blade 15 corresponding to the terminal channel 13 position.

A rotor 32 is provided for the exemplary wafer switch, centrally within the annular ring 20. Rotor 32 is made of insulation material and may be fabricated from a suitable laminate of low dielectric properties, or molded of a desirable plastic or composition material. The exemplary rotor 32 contains three equally spaced arms 33 that guide rotor 32 within the internal surface 34 of the annular stator 20. Rotor 32 has a central oblong opening 35 through which a corresponding central shaft is passed to operate the rotor into any of the angular positions with respect to the switch blades 15, 15. It is understood that the operating shaft cooperating with central opening 35 of rotor 32 is usually connected to a detent, whereby the shaft and the correpsonding rotor 32 are displaced into predetermined intermediate angular positions about the wafer switch, generally precisely at the central radial positions of the mounted switch blades 15, 15.

Thus, in a twelve-position V. H. F. tuner, the detent would "pocket" the rotor 32 at 30° positions about the wafer switch, resting its contact or operating arm 32 centrally of each of the switch blades 15 for electrical coaction therewith (see Figure 10). Into radial channel 36 of rotor 32 is mounted the electrical contacting arm 40 of the exemplary wafer switch. A pin 37 is supported transversely across channel 36 of rotor 32. Pin 37 may be molded with rotor 32 if so fabricated; or inserted in an opening such as 38, from one side of rotor 32 and cemented in to secure the pin 37. Pin 37 is thus supported transversely across the radial channel 36 of rotor 32 to in turn support the electrical contacting means 40 to be now described.

Figure 4:
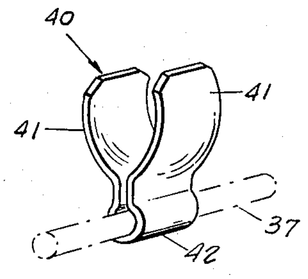
Figure 4 is an enlarged perspective view of the spring contact arm of the exemplary wafer switch.

Spring arm 40 is an important feature of the present invention. It serves to electrically connect the switch blades 15 selectively to the stationary collector ring 25. The spring arm 40 comprises two opposed cupped or dome shape arms 41, 41 extending from a cylindrical body portion 42. The cylindrical body portion 42 of the switch arm 40 is mounted about pin 37. Figure 4 is an enlarged perspective view of an exemplary form for switch arm 40. It is to be noted that the material of switch arm 40 is of a suitable springy metal such as Phosphorbronze. Its design is to create a spring pressure whereby the arms 41, 41 thereof press apart outwardly with respect to each other. Thus, a positive contact is assured between any of the switch blades 15 and the inner surface of collector ring 25 (Figure 3).

A continuous electrical circuit is accordingly established between any one switch blade 15 and the metal collector ring 25 through the looped spring arm 40 herein. A thin plating of silver on the contacting surfaces, as is usual switch blade practice, preserves the electrical condition of the coacting surfaces. It is to be noted that the electrical switch arm 40 shown and described herein is readily clipped into position about the pin 37 across its cylindrical base 42. Sufficient longitudinal contact and closeness of the cylinder base 42 of switch arm 40 with respect to pin 37 is desirable to prevent angular twisting of arm 40 from its desired radial position in rotor 32.

In the exemplary embodiment for the electrical switch wafer, the rotor arms 33 are made wider than the spacing between adjacent tips 45 of the switch blades 15. Also, the width of the spring contact arm 40 is likewise made somewhat larger than the spacing between adjacent edges 45 of the blades 15. Thus, with the rotor assembled as shown in Figures 1, 2 and 3 the rotor is captivated within the space defined by the inner surface 34 of the annular stator ring 20, the inner surface of the metallic collector ring 25, and the inwardly projecting tips 45 of each switch blade 15.

In assembling the electrical wafer switch herein, the component sub-assemblies essentially are: the twelve blades 15, 15 preset in stator ring 20; the rotor 32 including spring switch arm 40 mounted therein; and the metallic collector ring 25. The rotor arm sub-assembly is inserted from the back side of stator ring 20, and the collector ring 25 is mounted on the back of stator 20 through eyelets 27, 27 as seen in Figures 2 and 3. The rotor arm assembly is thus completely captivated, and in full operating condition, for the wafer switch. The wafer switch assembly is treated as an integral unit for the remainder of the electrical circuit application, as will now be understood by those skilled in the art. Electrical connection to the exemplary wafer switch assembly is made through the projecting connecting lugs 30, 31; and to the projecting slots 16 of blades 15.

Each of the blades 15, 15 of the upper frequency channel band, namely between channels 7 through 13, is connected by an arcuate rib 50, 50. The connecting ribs 50, 50 between the blades 15, 15 of the upper frequency band serve in the final wafer switch as an inductance loop between each of the corresponding channel blade positions. In the fabrication stage of the wafer switch, the loops or ribs 50, 50 also serve to utilize the blade assembly and to position each of the switch blades 15, 15 accurately with respect to the stator ring 20 that is molded, as will be set forth in more detail in connection with Figure 7 hereinafter. Figures 1 and 2 illustrate the six ribs or loops 50, 50 extending between each of the switch blades 15 for channels 7 through 13.

Figure 8:
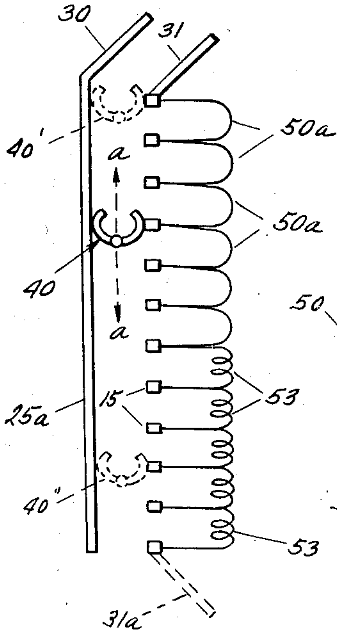
Figure 8 is a schematic electrical representation of the wafer switch embodied in Figure 1.

The electrical counterpart, in a V. H. F. tuner, for the exemplary wafer switch is schematically illustrated in Figure 8. Individual inductance loops *50a*, *50a* correspond to the physical ribs or loops 50, 50 of Figures 1 and 2. The physical proportioning of ribs 50, 50 is such as to provide suitable inductances between each of the aforesaid switch blades 15, 15 whereby their interconnection in series (as seen in Figure 8) provides the successive inductance steps between the channel 7 to 13 positions for the tuner.

While the ribs 50, 50 as shown in Figures 1 and 2 are all of identical physical construction, it is to be understood that they may be of differing shapes and dimensions, to conform to differing incremental inductances where desired at the successive steps in the high frequency band of the V. H. F. circuit. The basic feature herein is the provision of inductance loops 50, 50 (equal or diverse) to provide inductances 50*a* for the circuit shown in Figure 8 and that locate the switch blades 15, 16 and afford an inexpensive method of obtaining requisite inductance steps and switch blades for the V. H. F. tuner switch.

Figure 5:
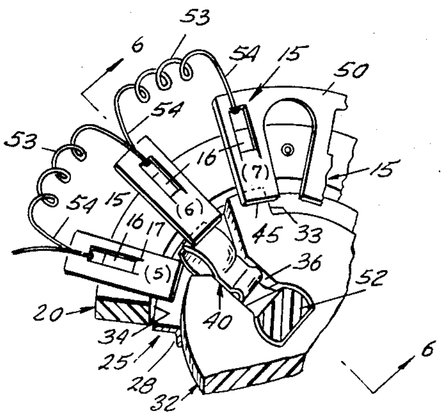
Figure 5 is an enlarged perspective view of a section of the wafer switch of Figure 1 shown in an engaged position.

Reference is now made to Figure 5 which is an enlarged perspective illustration of a section of the exemplary wafer switch in operative connection at channel 6 position. The rotor 32 is engaged by a tuning shaft 52 of oblong cross-section. The rotor arm 40 is shown in engagement with the blade 15 for channel 6. Each of the switch blades 15, 15 is rectangular and set in a position whereby its lengthwise axis is radial with respect to the axis of shaft 52. The thickness of each switch blade 15 is made substantial to provide ruggedness. Each blade 15 has an inner extension 45 projecting radially beyond the annular stator ring 20.

The spring contact arm 40 engages the selected switch blade 15, channel 6 position herein. The connection is made through switch arm 40 between the contiguous surface of projection 45 of blade 15 and the surface of collector ring 25. Inductance coils 53, 53 of suitable impedance are connected between the respective channel positions seen between channels 5 and 6 and 6 and 7 in Figure 5. The ends 54, 54 of each coil 53 are suitably soldered within the connection slots 16 of switch blades 15. The inductance rib 50, seen extending from the switch blade 15 of channel 7, is a "built-in" inductance of the switch wafer.

Figure 6:
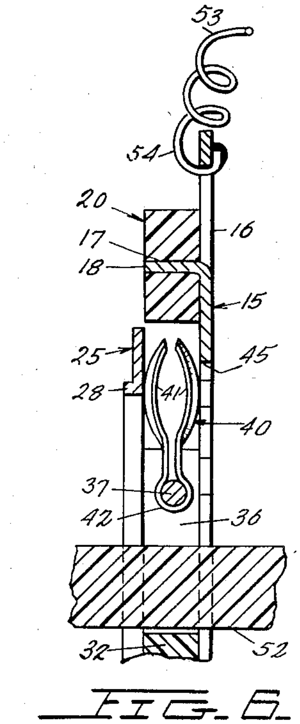
Figure 6 is a cross-sectional view through the switch of Figure 5, along the engaged section thereof at the line 6—6 taken in the direction of the arrows.

Figure 6 is a cross-sectional view through the switch engaging position of Figure 5. The spring switch arm 40 is shown clearly establishing firm contact between the inwardly projecting lug end 45 of switch blade 15 to a domed arm 41 of contactor 40; and the annular collector ring 25 at the opposite arm 41 thereof. The captivation of the rotor assembly herein, between the projecting tips 45 of each blade 15 and the stationary collector ring 25 is also evident in Figure 6. A substantial thickness is preferred for the body of annular ring 20. In the exemplary wafer switch, the thickness of stator ring 20, corresponding to the length of lugs 17, was one-eighth inch. Such thickness makes it convenient to design a sizeable cupped spring assembly 40 and contactor arms therefor to provide a rugged spring unit for long service durability. Furthermore, a substantial spacing is correspondingly afforded between the projecting tips 45 of each switch blade 15 and the annular ring 25, whereby capacity therebetween is reduced to a negligible value.

For the same reason, rotor 32 is preferably supported within the wafer switch through arms 33, 33 with open spaces at the rotor periphery, whereby the capacitance effect in the switch is further reduced. Such reduction of capacities of the switch components herein allows for high gain in the design of a V. H. F. tuner using such wafer switches. It is also to be realized that the thicker annular stator ring 20 adds to its inherent strength as a complete stator support for the wafer switch and permits the projections at either side of the switch blade 15 for the purposes herein.

Figure 7:
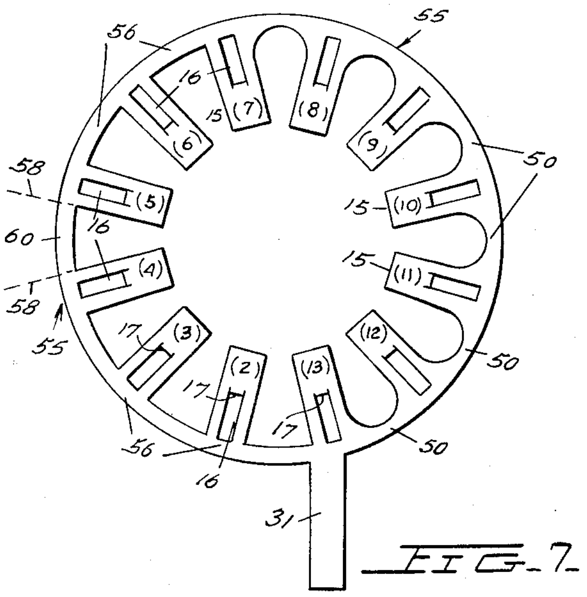
Figure 7 is a plan view of a metal stamping embodying the plurality of elements constituting the switch blades prior to fabrication of the switch of Figure 1.

An important feature of the present invention resides in the elimination of individual spring clips, eyelets and other multiplicity of small parts, and of their requisite individual assembly and positioning in the wafer switch. In accordance with the present invention, a unitary metal stamping 55, as seen in Figure 7, is used for the fabrication of the invention wafer switch. The stamping 55 embodies all of the switch blades 15, 15 required for the wafer switch, each in its accurate annular relationship and radial position. The stamping 55 also embodies the slots 16 and the projecting lugs 17 within each switch blade 15. Projecting lugs 17 are for engagement with the annular ring 20, and the connection slots 16 are for the switch blade 15 electrical connection to any other portion of the circuit in the manner of a connection lug.

Each of the switch blades 15, 15 in stamping 55 is interconnected by ribs remaining in the material and constitutes a circular structure. The interconnecting ribs 50, 50 between the upper channels 7 through 13 are seen in stamping 55 and are the inductance ribs 50, 50 described in connection with Figures 1 and 2. Corresponding ribs 56, 56 are provided between the switch blades 15, 15 for channels 2 through 6; with further ribs 56 interconnecting the switch blades of channels 2 and 6 to their contiguous channels 13 and 7, respectively, in the circle of blades 15. The electrical connection lug 31 for channel 13 switch blade is integral with stamping 55 as shown in the drawing.

Since the wafer switch of the present invention embodies flat switch blades 15, this inexpensive fabrication and incorporation in the wafer switch by mass production and automatic means is made feasible. The interconnecting ribs 50, 50 and 56, 56 between blades 15, 15 are designed to project beyond the outer rim 57 of the annular stator ring 20 (Figures 1 and 2).

The projection beyond the stator 20 of the inductance ribs 50, 50 and the corresponding connecting ribs 56, 56 of ring 55 is significant. In the case of the inductance loops 50, 50, freely extending loops result in a minimum of capacitance therein which permits more efficient circuitry. In the case of the interconnecting ribs 56, 56, their projection beyond rim 57 makes ready severance of these ribs feasible. Severance of ribs 56, 56 between the appropriate switch blades 15, 15 is accomplished in any suitable manner, preferably with jigs to minimize the time and labor involved. Each rib 56 is severed in a predetermined relation to a contiguous lug 15 and is illustrated in Figures 2 and 7 at section 60 between blades 4 and 5. The dotted radial lines 58, 58 define rib 60. Severance along lines 58, 58 defines the rectangular projecting blades 15. Each of the lower channel blades corresponding to channels 2 through 6 accordingly emerges as integral switch blades 15, 15 seen in Figure 1.

The exemplary wafer switch shows the switch blades corresponding to channels 7 through 13 as interconnected with built-in stamped inductance loops 50, 50. It is to be understood, however, that all of the twelve switch blades 15, 15 may be separate and integral for other applications of the invention wafer switches, eliminating the inductance ribs 50, 50 in the manner similar to the elimination of ribs 56, 56 to result in individual switch blades 15 for each switch position. It is also to be understood that more or less than the exemplary twelve switch blades may be utilized in a full or partial circle. Also, in place of a single connection lug 31 for the blade corresponding to channel 13, other positions are feasible for the connection lug, for more than one lug connector may be provided.

Figure 8 is a schematic electrical representation of the exemplary wafer switch. The circular collector ring 25 is represented by the linear bar 25*a* as the collector for the switch. The twelve switch blades 15, 15 are shown in a linear arrangement, parallel to bar 25*a*. The spring switch arm 40 engages selectively switch blades 15 with stationary collector 25*a*. The contact arm 40 is movable along the linear path of the switches and arm, in the direction indicated by arrows *a*, *a*. The switch blades 15, corresponding to channels 7 through 13, are interconnected by the six inductance ribs 50*a*, 50*a*. The lower frequency band of the V. H. F. channels, corresponding to the contacts between 2 through 6, are interconnected by five inductance coils 53, 53.

With switch arm 40 in the position shown at channel 10, the circuit between output leads 30, 31 of the switch encompasses three of the loops 50a in series. Thus, the inductance contribution of the wafer switch when in channel 10 position is predetermined by the inductance of the three loops 50a in series. When the switch arm 40 is moved to the upper position 40' contacting the blade for channel 13, all the inductance in the wafer switch is by-passed. When the switch arm 40 is moved to a lower position as 40', engaging the blade for channel 4, the wafer establishes an output inductance encompassed by the series connection of three of the outside wound inductances 53, 53 and all six of the inductance loops 50a.

It is to be understood that the inductances 53 may all be of different values between the channel positions, as may be the inductance loops at 50a, all as predetermined and desired. In other applications of the wafer switch, the elements between the individual switch positions may, instead of inductances, be condensers or resistors, or any other desired circuit element required by the system. Essentially, the invention herein is the provision of a novel wafer electrical multi-position switch for the aforesaid purposes or any other use within the scope of the device, as will be understood by those skilled in the art. A further connection lug 31a is shown extending in dotted line from the switch blade 15 corresponding to channel 2.

Figure 9 illustrates an application of the exemplary wafer switch to a single stage in a V. H. F. television tuner. A chassis surface or plate 59 of the tuner supports the leg 21 of the wafer switch 60, projection 22 thereof reposing in a slot of panel 59. Electrical connection to the wafer switch 60 is made through the projecting electrical lugs 30, 31. The inductance loops 50, 50 constituting the ribs between the high frequency channels are directly placed in the tuner circuit, as they are integral with the corresponding switch blades 15, and connected to the exterior circuit through lug 31. The coils 53a connected between the switch blades 2 to 7 in the embodiment of Figure 9 are all mounted on a common coil form 61. Coil form 61 contains the successive inductance windings 53a 53a constituting the five coils corresponding to 53, 53 of Figure 8.

At suitable points of the coils 53a they are connected across to the switch blades 15, 15 of the wafer switch 60 to complete the inductance circuit for the twelve contacts of switch 60. The integral inductance assembly 65 herein comprises the respective inductance windings 53a on one coil form 61, their terminals 62, 62 for connection to the switch blades and, where desired, tuning slugs 63 and 64 at either end thereof. The composite coil 65 is mounted to chassis panel 59 by a suitable bracket 66. The assembly of the exterior coils necessary to complete the V. H. F. wafer assembly 60, as a unitary structure 65, lends itself to ready mass production thereof, and ready assembly with switch blades 15 of switch 60.

Figure 10 illustrates a V. H. F. tuner incorporating the simplified assembly and construction of wafer switches and coil assemblies as afforded by the present invention. A central tuning shaft 70 extends longitudinally through the tuner, and is suitably supported in openings in the front and rear panels 71, 72 of the tuner extending from panel 59. Coacting with the rear end of tuner shaft 70 is a suitable detent mechanism 73 on rear panel 72. The tuner of Figure 10 incorporates four wafer switch assemblies corresponding to that illustrated at 60 in Figure 9. These four switches are schematically indicated by the dotted rectangles 60a, 60b, 60c and 60d mounted to panel 59 through their extending feet.

The wafer switch 60a is incorporated in the oscillator circuit (not shown) suitably isolated by shield 74. The wafer switch 60b is in circuit with the multiple inductance 65', corresponding to the arrangement of Figure 9, and is in circuit with the converter tube input of the tuner (not shown). The wafer switch 60c is in circuit with its associated multiple inductance 65'' and is connected to the output stage of the antenna amplifier section (not shown) of the tuner. The wafer switch 60d is in circuit with the attendant pre-selector section of the tuner. The lower frequency inductances of pre-selector section 60d and oscillator section 60a are not shown and may be of the form 65 or as separate coils shown in Figure 5. The circuit arrangements for the tuner herein shown schematically may take any desirable form well known in the art, and the remaining components thereof not shown in the schematic arrangement for purposes of clarity are understood by those skilled in the art.

The schematic diagram, Figure 10, shows the plural coils 65' and 65'' close together. They are mounted close and in parallel relationship to provide a definite mutual inductance between the coil windings thereof. Such mutual coupling between the windings of the amplifier output stage and the converter input stage for the inductances corresponding to channels 2 through 6 are desirable in the tuner. The corresponding coupling for the higher band, namely channels 7 through 13, is afforded either by proximity of the wafer switches 60b and 60c or their circuit interconnection by a small capacitance.

While the electrical wafer switches have been illustrated in an exemplary embodiment, it is to be understood that the present invention lends itself to various other forms and applications, as will be apparent to those skilled in the art. The principles and features of the present invention are applicable to electrical wafer switches usable in general in communication circuits, electrical circuits and instrumentation circuits, incorporating a plurality of circuit conditions and are applicable in equipment subjected to a high degree of vibration, temperature change or shock conditions, without deleterious effects. Thus, the present invention is not intended to be limited except as set forth in the following claims.

I claim:

1. A television wafer switch of the character described comprising a plurality of switch plates each having a flat surface and arranged spacedly about an arc, a stator member of insulation material with a face area and an interior rim extending therefrom, the stator face area securing each of said plates in said arc in a plane, a collector segment secured with said stator member, a switching unit for establishing electrical connection selectively between said plates and said segment consisting of an essentially U-shaped spring with opposed sides pressed against said segment and said plates, the width of said swtiching unit being greater than the spacing between adjacent forward portions of said switch plates that project inwardly of the switch for containing the switching unit with respect to the plates, and a rotor carrying said switching unit, a plurality of legs extending from said rotor and engaging the interior rim of said stator member to rotatably support said rotor therewithin, the width of said rotor legs being greater than the spacing between adjacent forward plate portions, whereby said rotor with said switching unit is captivated in the switch between said segment and the said plates in fully operative condition to provide a unitary wafer switch.

2. An electrical wafer switch of the character described comprising a plurality of switch blades arranged spacedly in a circular path, an annular stator member of insulation material with a face area and an interior rim extending therefrom, the stator face area securing each of said blades in said path in a plane, said blades being arranged on said stator member with a forward portion of each blade projecting inwardly from said stator member for establishing switching connections, an annular collector conductor secured with said stator member spaced from said blade plane with its collector portion opposite said forward blade portions and contacting means for establishing electrical connection selectively between said forward portions and said collector conductor, and a rotor carrying said contacting means, said rotor having a body diameter less than that of the inward tips of said blades to minimize capacitance effects therewith, a plurality of legs extending from said rotor and engaging the interior rim of said stator member to rotatably support said rotor therewithin.

3. An electrical wafer switch of the character described comprising a plurality of switch blades arranged spacedly in a circular path, an annular stator member of insulation material with a face area and an interior rim extending therefrom, the stator face area securing each of said blades in said path in a plane, said blades being arranged on said stator member with a forward portion of each blade projecting radially inwardly from said stator member for establishing switching connections, a collector ring secured with said stator member in the vicinity of the forward portions of said blades spaced from said blade plane, contacting means for establishing electrical connection selectively between said blades and said ring incorporating a spring with opposed sides that are dome-shaped and pressed against said ring and said forward portions, and a rotor carrying said contacting means, a plurality of legs extending from said rotor and engaging the interior rim of said stator member to rotatably support said rotor therewithin, the width of said rotor legs being greater than the spacing between adjacent forward blade portions, whereby said rotor with said contacting means is captivated in the switch between said ring and the said forward portions in fully operative condition to provide a unitary wafer switch.

4. An electrical wafer switch of the character described comprising a plurality of switch plates each having a flat surface and arranged spacedly in an arcuate path in a plane, a stator member of insulation material with a face area and an interior rim extending therefrom, the stator face area securing each of said plates through a projecting lug thereof, said plates being arranged on said stator member with a forward portion from each plate projecting radially inwardly from said stator member for establishing switching connections and with a rearward portion from each plate projecting outwardly from said stator member for individual external electrical connection, a collector conductor section secured with said stator member and arranged opposite the projecting forward portions of said plates, and a contactor for establishing electrical connection selectively between said forward portions and said conductor section incorporating an essentially U-shaped spring with opposed sides that are dome-shaped and pressed against said section and said forward portions, and a rotor carrying said contacting means, said rotor having a body diameter less than that of the inward tips of said blades to minimize capacitance effects therewith, a plurality of legs extending from said rotor and engaging the interior rim of said stator member to rotatably support said rotor therewithin, the width of said rotor legs being greater than the spacing between adjacent forward plate portions, whereby said rotor with said contacting means is captivated in the switch between said ring and the said forward portions in fully operative condition to provide a unitary wafer switch.

References Cited in the file of this patent

UNITED STATES PATENTS

| | | |
|---|---|---|
| 2,447,718 | Simpson | Aug. 24, 1948 |
| 2,561,930 | Klay | July 24, 1951 |
| 2,549,998 | Allison | Apr. 24, 1951 |
| 2,594,190 | Mastney | Apr. 22, 1952 |
| 2,631,211 | Klay | Mar. 10, 1953 |
| 2,666,253 | Morberg | Jan. 19, 1954 |
| 2,670,530 | Regnier | Mar. 2, 1954 |
| 2,694,756 | Warnke | Nov. 16, 1954 |
| 2,750,459 | Hosea et al. | June 12, 1956 |

FOREIGN PATENTS

| | | |
|---|---|---|
| 907,460 | France | June 25, 1945 |
| 564,085 | Great Britain | Sept. 12, 1944 |